United States Patent [19]
Van Bezooijen

[11] Patent Number: 6,085,075
[45] Date of Patent: Jul. 4, 2000

[54] COMMUNICATION SYSTEM, A COMMUNICATION DEVICE AND A FREQUENCY SYNTHESIZER

[75] Inventor: Adrianus Van Bezooijen, Nijmegen, Netherlands

[73] Assignee: U.S. Philips Corporation, New York, N.Y.

[21] Appl. No.: 09/205,977

[22] Filed: Dec. 4, 1998

[30] Foreign Application Priority Data

Dec. 5, 1997 [EP] European Pat. Off. .............. 97203828

[51] Int. Cl.[7] ................................ H04B 1/40; H04B 1/50
[52] U.S. Cl. ...................... 455/260; 455/265; 455/180.1; 455/180.3; 455/183.1; 455/188.1; 455/76; 375/326; 375/327; 375/376
[58] Field of Search .................................. 455/76, 75, 77, 455/86, 71, 87, 553, 180.1, 180.3, 188.1, 183.1, 17, 260, 265; 375/354, 373, 376, 326–327; 331/2

[56] References Cited

U.S. PATENT DOCUMENTS

| | | | |
|---|---|---|---|
| 5,471,652 | 11/1995 | Hulkko | 455/76 |
| 5,519,885 | 5/1996 | Vaisanen | 455/76 |
| 5,630,214 | 5/1997 | Yamamoto et al. | 455/180.1 |
| 5,809,398 | 9/1998 | Mogerg et al. | 455/17 |
| 5,822,366 | 10/1998 | Rapeli | 375/354 |
| 5,896,562 | 4/1999 | Heinonen | 455/76 |
| 5,898,907 | 4/1999 | Maruyama | 455/76 |
| 5,937,335 | 8/1999 | Park et al. | 455/76 |

FOREIGN PATENT DOCUMENTS 66384320A   4/1988   Japan .

OTHER PUBLICATIONS

By J. Crols et al. "A Single–Chip 900 MHz CMOS Receiver Front–End with High Performance Low–IF Topology", IEEE Journal of Solid State Circuits, vol. 30, No. 12, Dec. 1995, pp. 1483–1492.

*Primary Examiner*—Fan Tsang
*Assistant Examiner*—Simon Nguyen

[57] ABSTRACT

A radio device has an antenna for receiving a radio frequency signal, and a radio frequency mixer for down-converting the received radio frequency signal to an intermediate frequency signal. The radio device further has a frequency synthesizer for generating a local oscillator signal for the radio frequency mixer. The frequency synthesizer has a first local oscillator loop for producing a band selective local oscillator signal, a second local oscillator loop for producing a channel selective local oscillator signal, and a local oscillator signal mixer for mixing the band and channel selective local oscillator signals. The band selective local oscillator signal selects a band, and the channel selective local oscillator signal selects a channel within the band. The generated local oscillator signal is an output signal of the local oscillator signal mixer.

20 Claims, 2 Drawing Sheets

COMMUNICATION SYSTEM, A COMMUNICATION DEVICE AND A FREQUENCY SYNTHESIZER

BACKGROUND OF THE INVENTION

1. Field of the Invention

The present invention relates to a frequency synthesizer outlined in the preamble of claim 1.

The present invention further relates to a communication system and a communication device.

2. Description of the Related Art

J. Crols et al., describes in "A Single-Chip 900 MHz CMOS Receiver Front-End with High Performance Low-IF Topology", IEEE Journal of Solid State Circuits, vol. 30, No. 12, December 1995, pp 1483–1492, the realization of a fully integrated high performance receiver comprising an RF (Radio Frequency) frequency synthesizer for frequency down conversion. Apart from the required degree of integration of the several functional circuits in a communication device or system comprising such a frequency synthesizer one of the major problems not addressed by Crols et al. is the relatively high power consumption of the frequency synthesizer(s).

SUMMARY OF THE INVENTION

It is an object of the present invention to provide a frequency synthesizer having a reduced power consumption, without affecting the required degree of integration.

To this end the frequency synthesizer according to the invention comprises RF mixer means, and local oscillator means with local oscillator mixer means and band and channel selection means, the local oscillator means being coupled to the RF mixer means, and the band and channel selection means being coupled to the local oscillator mixer means.

It is noted here that it is known from JP-A-63-84320 to include in a frequency synthesizer a frequency multiplier connected single local oscillator mixer means which is coupled to a reference crystal oscillator phase locked loop controlled parallel arrangement of a frequency variable phase locked loop and a third phase locked loop. This known microwave band frequency synthesizer does not disclose RF mixer means and only discloses one frequency variable phase locked loop, whereas the other parallel phase locked loop is supposed to provide a fixed frequency and does therefore not provide a simultaneous band selection.

It is an advantage of the frequency synthesizer according to the invention that due to the relatively high reference frequency the band and simultaneously active channel selection at this reference frequency provides possibilities in the practical realisation of the frequency synthesizer to decrease power consumption, which is inverse proportional to its working frequency. In addition this synthesizer concept has inherent possibilities to relax VCO noise requirements, that is the presence of side band noise in the spectrum of oscillators, such as voltage controlled oscillators (VCOs), applicable in the local band and channel means. The reduced noise requirements reduce the said decreased power consumption further, because the higher the signal to noise ratio is the higher the power consumption has to be to comply with such ratio. As a consequence in portable or mobile applications of the frequency synthesizer such as in pagers, portable telephones etcetera the life-time of batteries included in communication devices has been increased.

It is a further advantage of the frequency synthesizer according to the invention that if an I and Q pair of paths is being used in the local oscillator means, applicable accurate wide-band 90 degrees phase shifters can easily be integrated as divide by two means which can be integral part of phase locked loop dividers usable in the local oscillator mixer means. This obviates the need for accurate external phase shifters in the local oscillator mixer means which would require tuning of components, especially in case of multi-band applications.

In an embodiment of the frequency synthesizer according to the invention phase locked loops, in particular separate phase locked loops are being used. This gives rise to a new architecture when it comes to the synthesized radio concept in that a first phase locked loop provides a first local oscillator signal at a high frequency, which first phase locked loop may be wide-band in order to clean the above mentioned VCO side band noise, which may now originate from a relatively noisy, and thus low power, fully integrated first phase locked loop. Simultaneously a second local oscillator signal which is mixed in the local oscillator means with the first local oscillator signal provides channel selection.

According to a still further embodiment of the frequency synthesizer according to the invention a frequency dividing means is being used coupled between the local oscillator mixer means and the two separate phase locked loops. As a advantageous consequence the respective frequency division ratios (which ratios in particular are 2) of the frequency dividing means reduce the side band noise of each of the VCOs. Especially for fully integrated LC oscillators the high oscillating frequency results in relatively low power consumption of the VCO due to the increased Q-factor of the applied coils. The relatively high VCO frequency asks for smaller self inductances which allows for integration on less chip area.

In a preferred embodiment the frequency dividing means generally embodied as easy to integrate dividers have programmed frequency division ratios. This offers great flexibility in the practical application and in the frequency band and selection values of the frequency synthesizer according to the invention upon application in (tele)communication devices and systems, such as radio transmission systems, audio- and/or video systems, control systems, telemetry systems, local area networks, wide area networks, cordless or cellular pager or telephone systems, car-transceivers for mobile communication, or a transceivers in radio base stations of a mobile networks.

BRIEF DESCRIPTION OF THE DRAWING

At present the frequency synthesizer according to the invention and its applications in a variety of types of communication devices and systems will be elucidated further together with its additional advantages while reference is being made to the appended drawing, wherein similar components are being referred to by means of the same reference numerals.

In the drawing.

DESCRIPTION OF THE PREFERRED EMBODIMENTS

Figure 1:
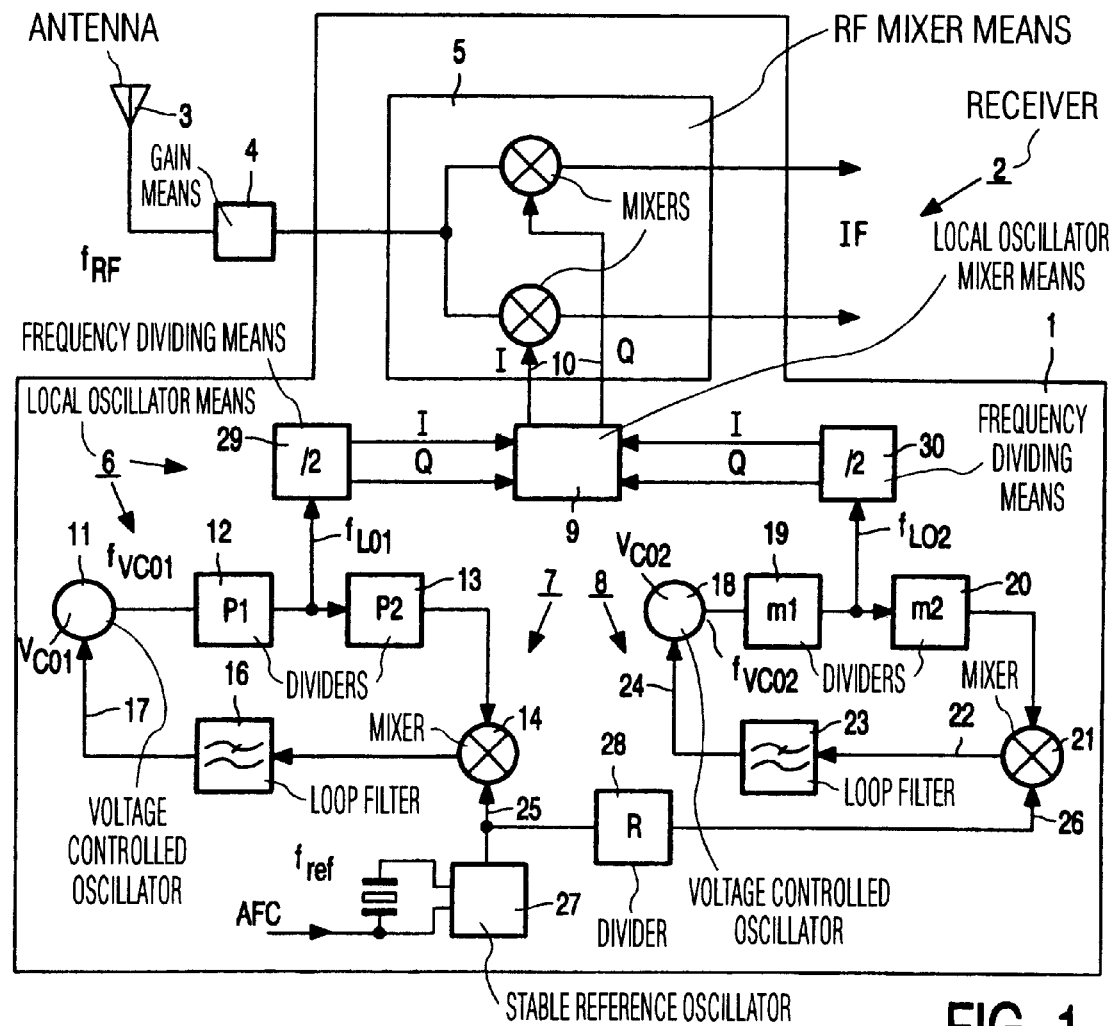
FIG. 1 shows a detailed arrangement of a possible embodiment of the frequency synthesizer according to the invention here applied in a receiver.

FIG. 1 shows a frequency synthesizer 1 applied in a receiver 2, which is partly shown. The receiver 2 comprises an antennae 3 coupled to filter and gain means 4, RF mixer means 5 coupled to the said means 4, and local oscillator means 6 coupled to the RF mixer means 5. The remaining parts of the receiver 2, which may be implemented either in an analog or digital way are known per se and therefore not described here. An RF signal ($f_{RF}$) received on the antennae 3 is filtered, amplified and mixed with a local oscillator signal from oscillator means 6 to yield a possible IF signal, and then processed further in the remaining part of the receiver 2. The receiver 2 can either be a embodied as a low-IF, zero-IF, or as a IF receiver, such as a well known superheterodyne receiver. The RF mixer means 5 structure can include one mixer or a two parallel quadrature mixer structure as shown in FIG. 1, whereas a four parallel quadrature mixer structure although possible seems less likely. Of course application of the frequency synthesizer 1 is possible with frequency down conversion as well as in frequency up conversion such as in transmitters, or in transceivers.

The local oscillator means 6 comprises band selection means in the form of a first local oscillator means 7 and channel selection means in the form of a second local oscillator means 8. The local oscillator means 6 further comprises local oscillator mixer means 9 coupled to the band and channel selection means 7 and 8. Depending on the embodiment of the RF mixer means 5 the local oscillator mixer means 9 thus provide a single or quadrature (I and Q) local oscillator signal at output 10 thereof, which output 10 is connected to the RF mixer means 5. The output 10 thus provides a local oscillator signal which simultaneously represents a band frequency as well as a channel frequency selection oscillator signal the operation whereof will be elucidated later on in this description.

The band and channel selection means are embodied as phase locked loops 7 and 8. The first phase locked loop (PLL) 7 comprises a first voltage controlled oscillator (VCO) 11 for providing a signal having a frequency $f_{vco1}$, a first frequency divider 12 having a frequency division ratio P1 and connected to VCO 11 for providing a signal having frequency $f_{LO1}$. The signal $f_{LO1}$ is fed through a second frequency divider 13 in the PLL 7 to a phase detector which may as shown in FIG. 1 be embodied as a simple first mixer 14 having an output 15 for providing a control signal through a loop filter 16 to a frequency control input 17 of the VCO 11. Divider 13 has a frequency division ratio P2. Similarly the second phase locked loop (PLL) 8 comprises a second voltage controlled oscillator (VCO) 18 for providing a signal having a frequency $f_{VCO2}$, a third frequency divider 19 having a frequency division ratio M1 and connected to VCO 18 for providing a signal having frequency $f_{LO2}$. The signal $f_{LO2}$ is fed through a fourth frequency divider 20 in the PLL 8 to a further phase detector which may as shown in FIG. 1 be embodied as a simple second mixer 21 having an output 22 for providing a control signal through a loop filter 23 to a frequency control input 24 of the VCO 18. Divider 20 has frequency division ratio M2. Phase detectors, in this case mixers 14 and 21 have further inputs 25 and 26 respectively. In an embodiment the frequency synthesizer 1 comprises a stable reference oscillator, such as a crystal oscillator 27 providing a stable frequency $f_{ref}$, generally with an AFC for providing frequency offset compensation, which oscillator 27 is connected to input 25 and coupled to input 26 through a fifth frequency divider 28 having a wanted frequency division ratio R.

Preferably any or each of the aforementioned dividers 12, 13, 19, 20, and 28 have programmable frequency division ratios (these may be integers or fractional numbers) which offers frequency choice flexibility. In particular the frequency division ratio of third frequency divider 19 is programmable such that for all frequency bands of the receiver or transmitter wherein the frequency synthesizer 1 is being applied an optimum frequency range for $f_{VCO2}$ covering said bands can be chosen while the oscillating frequency range of VCO 18 remains the same.

The embodiment of the frequency synthesizer 1 as shown in FIG. 1 is also provided with further frequency dividing means 29 and 30 connected between the separate PLLs 7 and 8 respectively. These dividing means 29 and 30 easily provide—embodied as simply to integrate phase shifters—quadrature output signals usable as oscillator input signals for the possibly quadrature local oscillator mixer means 9, without the requirement to apply well known accurate 90 degrees phase shifters for providing the necessary quadrature oscillator signals to the local oscillator mixer means 9. Essentially the means 29 and 30 are to be considered as an easy implementation of preferably wide band phase shifters. Such phase shifters could comprise passive or active RC/LC networks for providing the mentioned quadrature output signals.

Figure 2:
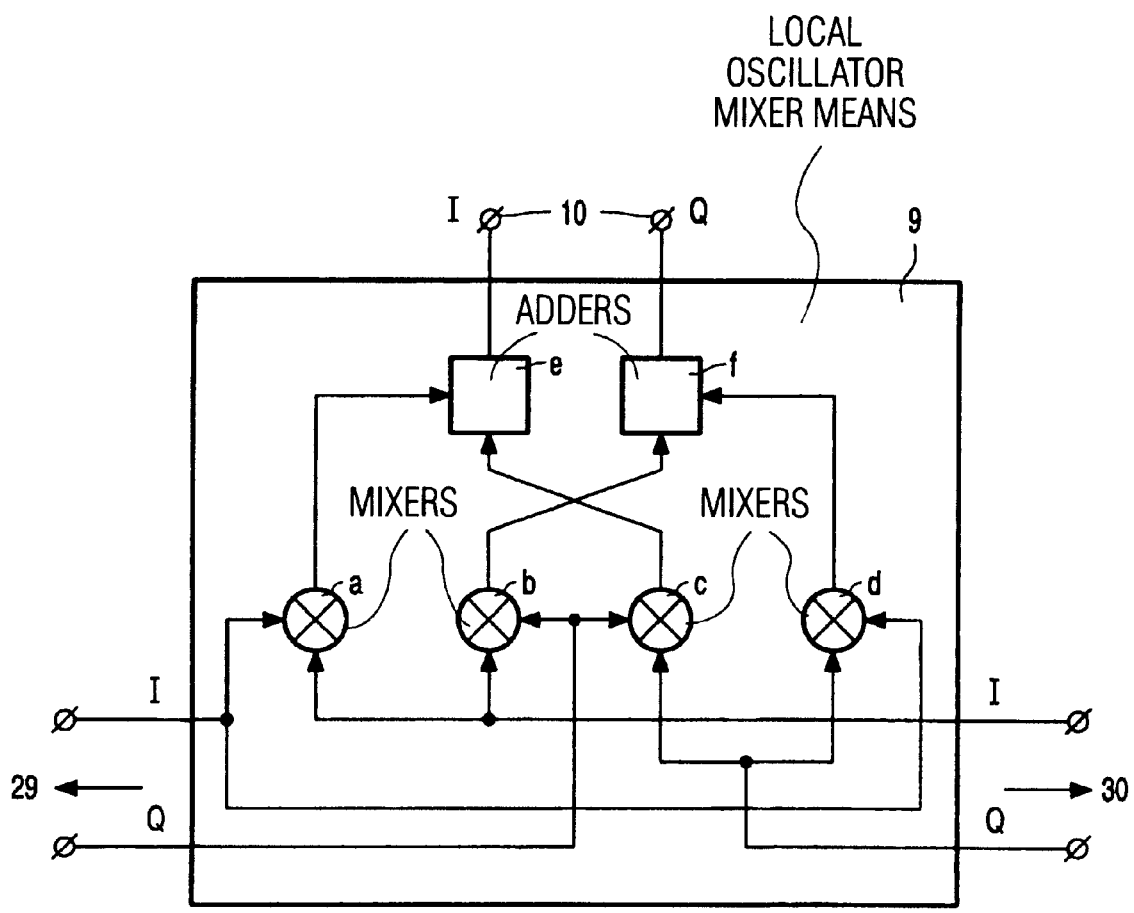
FIG. 2 shows a possible double quadrature arrangement of mixers in a local oscillator mixer means for application in the frequency synthesizer of FIG. 1.

FIG. 2 discloses a possible double quadrature arrangement of four mixers a, b, c, and d, whose inputs are connected to respective I and Q signals originating from said means 29 and 30 respectively, and whose outputs are connected to respective adder e and f, each having a respective output for providing the I and Q signals to output 10 of the local oscillator mixer means 10. In case the RF mixer means 5 shows a one mixer structure one of the adders e and f can be dispensed with and the pair of mixers connected thereto can be deleted. Depending on the signs of the addition in the adders e, f of the output signal(s) the output signal on output 10 provides rejection of either the upper or the lower frequency side band components $(f_{LO1})/2)+/-(f_{LO1}/2)$.

Table I hereunder specifies possible choices of operating frequencies for the embodiment as shown, which is particularly advantageous for paging operations in the RF frequency range from 130 MHz to 930 MHz, for instance.

TABLE I

| $f_{RF}$ [MHz] | $f_{ref}$ [MHz] | $f_{VCO1}$ [MHz] | P1 | P2 | $f_{LO1}$ [MHz] | $f_{LO2}$ [MHz] | M1 | $f_{VCO2}$ [MHz] |
|---|---|---|---|---|---|---|---|---|
| 930 | | | 1 | 24 | 1600 | 260 | 1 | 260 |
| 490 | | | 2 | 12 | 800 | 180 | 2 | 360 |
| 450 | | | | | | 100 | 3 | 300 |
| 410 | | | 3 | 8 | 533 | 386 | 1 | 386 |
| | | | | | | 286 | 1 | 286 |
| 330 | 67 | 1600 | 3 | 8 | 533 | 140 | 2 | 280 |
| 280 | | | 4 | 6 | 400 | 160 | 2 | 320 |
| 180 | | | 6 | 4 | 267 | 40 | 8 | 320 |
| 160 | | | | | | 54 | 6 | 324 |
| 160 | | | 4 | 6 | 400 | 80 | 4 | 320 |
| 130 | | | | | | 140 | 2 | 280 |

By changing the frequency division ratios P1 and P2, while keeping P1*P2 constant different LO1 frequencies can be generated for different frequency bands to be selected and covered. PLL 7 is wide band which is being determined by the loop filter 16 and the side band noise of VCO 11 is being cleaned up by the loop itself. A relatively high $f_{ref}$ of 67 MHz is used to relax the spurious rejection requirements of the loop filter 16. Due to this high reference frequency the second PLL 8 is used for channel selection. The lower frequency choice of VCO 18 allows for the realisation of a low noise VCO 18 at relatively low power or the use of a relatively noisy, high frequency, VCO 18 in combination with the dividers 19 and 20. The divider 19 reduces the VCO's 18 side band noise by its frequency division ratio, which allows for a reduction in the power dissipation in the frequency synthesizer 1, because generally speaking the power dissipation of a VCO increases with its increasing carrier to noise ratio. Thus a low power easy to integrate solution is thus provided. At wish the output oscillator frequency $f_{VCO2}$ of VCO 18 can advantageously be chosen around 2 GHz by increasing M1 with a factor 6 to 10.

Figure 3:
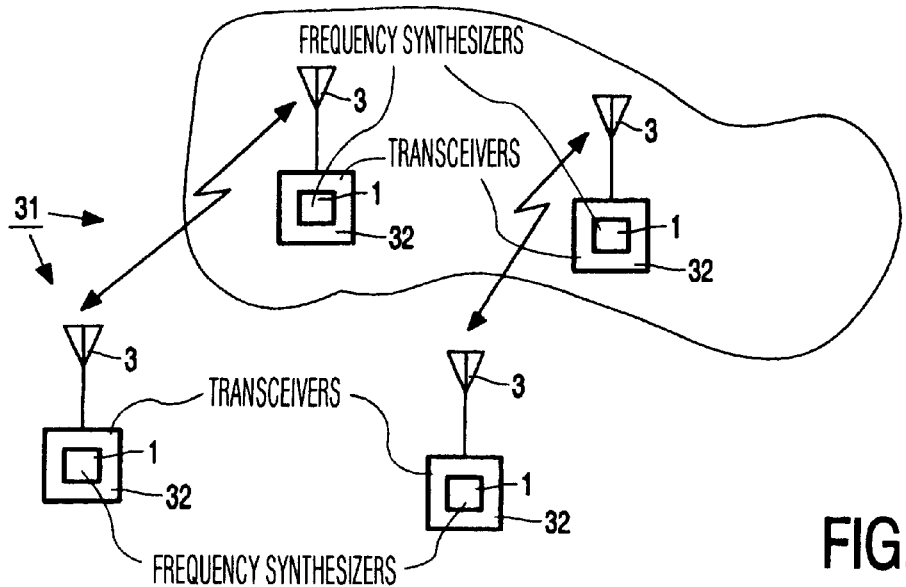
FIG. 3 schematically shows a (tele)communication system having communication devices provided with a frequency synthesizer according to the invention.

FIG. 3 shows a telecommunication system 31 comprising several transceivers 32 provided with one or more frequency synthesizers 1. The telecommunication system 31 can be a radio transmission system, audio- and/or video system, control system, telemetry system, a terrestrial/satellite system or a local area network. The transceivers 1 are also applicable in cordless or cellular telephone systems, as well as in a handset, a car-transceiver for mobile communication, portable devices or a transceiver in a radio base station of a mobile network.

In view of the foregoing it will be evident to a person skilled in the art that various modifications may be made within the spirit and the scope of the present invention as hereinafter defined by the appended claims and that the present invention is thus not limited to the examples provided.

What is claimed is:

1. A radio device comprising:
    an antenna for receiving a radio frequency signal;
    a radio frequency mixer for down-converting said radio frequency signal to an intermediate frequency signal;
    a first local oscillator loop, said first local oscillator loop producing a band selective local oscillator signal;
    a second local oscillator loop, said second local oscillator loop producing a channel selective local oscillator signal; and
    a local oscillator signal mixer for mixing said band selective local oscillator signal and said channel selective local oscillator signal, said local oscillator mixer producing a local oscillator signal for said radio frequency mixer, a band being selected by said band selective local oscillator signal, a channel being selected by said channel selective local oscillator signal, and said channel being selected within said band.

2. A radio device as claimed in claim 1, wherein said first local oscillator loop is a first phase locked loop, and said second local oscillator loop is a second phase locked loop.

3. A radio device as claimed in claim 2, wherein said first phase locked loop comprises first divider means, and said second phase locked loop comprises second divider means.

4. A radio device as claimed in claim 3, wherein said first divider means is a cascade of a first divider and a second divider.

5. A radio device as claimed in claim 4, wherein a frequency dividing ratio of said first and second dividers is programmable.

6. A radio device as claimed in claim 3, wherein said second divider means is a cascade of a third divider and a fourth divider.

7. A radio device as claimed in claim 6, wherein a frequency dividing ratio of said third and fourth dividers is programmable.

8. A radio device as claimed in claim 1, wherein said radio device comprises a reference oscillator, said reference oscillator producing an oscillator reference signal for said first and second local oscillator loops.

9. A radio device as claimed in claim 1, wherein said radio device comprises third frequency dividing means, said first frequency dividing means being coupled between inputs of said local oscillator signal mixer and said first and second local oscillator loops.

10. A radio device as claimed in claim 7, wherein said third frequency dividing means is programmable.

11. A radio device as claimed in claim 1, wherein said radio frequency mixer is a first quadrature mixer.

12. A radio device as claimed in claim 1, wherein said local oscillator signal mixer is a second quadrature mixer.

13. A radio device as claimed in claim 12, wherein said second quadrature mixer comprises a first mixer, a second mixer, a third mixer, a fourth mixer, a first adder, and a second adder, said band selective local oscillator signal being a quadrature signal with a first in-phase component and a first quadrature component, said channel selective local oscillator signal being a quadrature signal with a second in-phase component and a second quadrature component, said first in-phase component being provided to an input of said first mixer and to an input of said fourth mixer, said first quadrature component being provided to an input of said second mixer and to an input of said third mixer, said second in-phase component being provided to a further input of said first mixer and to a further input of said second mixer, said second quadrature component being provided to a further input of said third mixer and to a further input of said fourth mixer, respective output signals of said first and third mixers being added in said first adder, respective output signals of said second and fourth mixers being added in said second adder, and said local oscillator signal being a quadrature signal at respective outputs of said first and second adders.

14. A frequency synthesizer for use in a radio device with an antenna for receiving a radio frequency signal and a radio frequency mixer for down-converting said radio frequency signal to an intermediate frequency signal, said frequency synthesizer comprising:
    a first local oscillator loop, said first local oscillator loop producing a band selective local oscillator signal;
    a second local oscillator loop, said second local oscillator loop producing a channel selective local oscillator signal; and
    a local oscillator signal mixer for mixing said band selective local oscillator signal and said channel selective local oscillator signal, said local oscillator mixer producing a local oscillator signal for said radio frequency mixer, a band being selected by said band selective local oscillator signal, a channel being selected by said channel selective local oscillator signal, and said channel being selected within said band.

15. A frequency synthesizer as claimed in claim 14, wherein said first local oscillator loop is a first phase locked loop, and said second local oscillator loop is a second phase locked loop.

16. A frequency synthesizer as claimed in claim 15, wherein said first phase locked loop comprises first divider means, and said second phase locked loop comprises second divider means.

17. A frequency synthesizer as claimed in claim 16, wherein said first divider means is a cascade of a first divider and a second divider.

18. A frequency synthesizer as claimed in claim 17, wherein a frequency dividing ratio of said first and second dividers is programmable.

19. A frequency synthesizer as claimed in claim 16, wherein said second divider means is a cascade of a third divider and a fourth divider.

20. A frequency synthesizer as claimed in claim 19, wherein a frequency dividing ratio of said third and fourth dividers is programmable.

* * * * *